United States Patent [19]

Garcia

[11] 4,011,529
[45] Mar. 8, 1977

[54] DIRECTIONAL POWER DETECTOR FOR PROPAGATING WAVES

[75] Inventor: Arthur Garcia, Woodbury, N.J.
[73] Assignee: RCA Corporation, New York, N.Y.
[22] Filed: Sept. 25, 1975
[21] Appl. No.: 616,886
[52] U.S. Cl. .............................. 333/10; 324/58 R
[51] Int. Cl.² ......................................... H01P 5/18
[58] Field of Search ................. 324/95, 58 R, 58 A, 324/58 B; 333/10, 24 C

[56] References Cited
UNITED STATES PATENTS

| | | | |
|---|---|---|---|
| 2,808,566 | 10/1957 | Douma | 324/95 X |
| 3,701,057 | 10/1972 | Hoer | 333/10 |
| 3,829,770 | 8/1974 | Stevens | 333/10 X |

Primary Examiner—Paul L. Gensler
Attorney, Agent, or Firm—Edward J. Norton; Robert L. Troike

[57] ABSTRACT

A device for detecting the power of incident or reflected waves along a transmission line is described which includes a capacitive pick-up element in series with a summing capacitor between the two conductors of the transmission line. The capacitive pick-up element provides a current sample through the summing capacitor in proportion to the line voltage. A coupling loop positioned in the approximate region of the capacitive pick-up element and in series resonance with the summing capacitor provides a current sample through the summing capacitor in proportion to the line current. The coupling loop is of highly resistive material to maintain the magnitude and phase of the developed line current sample relatively independent of frequency over a relatively broad range of frequencies.

5 Claims, 4 Drawing Figures

DIRECTIONAL POWER DETECTOR FOR PROPAGATING WAVES

The invention herein described was made in the course of or under a contract or subcontract with the Department of the Navy.

BACKGROUND OF THE INVENTION

This invention relates to RF (radio frequency) directional couplers and more particularly to a device for detecting incident or reflected waves.

The detection of the power of incident or reflected propagating RF waves depends on sampling of RF line voltage and RF line current and comparing vectorially two current derivatives of the line voltage and line current. The prior art systems have very poor sensitivity in the nulling or substraction process of the line voltage and line current energy sample in the reverse or reflected power indicating mode. The result is spurious residual output when sampling a transmission line terminated in a matched load or loads departing slightly from the transmission line characteristic impedance, causing the line VSWR (Voltage Standing Wave Ratio) to depart from a value of one-to-one. Such prior art devices when used to turn back the drive of a transmitter as a function of deteriorating antenna load impedance provide signals that falsely turn back the transmitter drive, particularly on AM modulation. It is desirable not to reduce transmitter drive until antenna load mismatch approaches a higher value that would seriously damage or degrade the transmitter.

BRIEF DESCRIPTION OF INVENTION

Briefly, a device for detecting the power of an incident or reflected wave comprises a capacitive pick-up element and a coupling loop positioned along one of the conductors of a transmission line. The capacitive pick-up element and the coupling loop are coupled to a summing capacitor. The capacitive pick-up element provides current through the summing capacitor in proportion to the line voltage, and the coupling loop provides current through the summing capacitor in proportion to the line current. The coupling loop is constructed of highly resistive material to maintain the phase and magnitude of the line current sample relative to the transmission line current essentially independent of frequency.

DETAILED DESCRIPTION OF INVENTION

A more detailed description follows in conjunction with the following drawings wherein, FIG. 1 is a cross-sectional view of a power detector according to one embodiment of the present invention.

Figure 1:
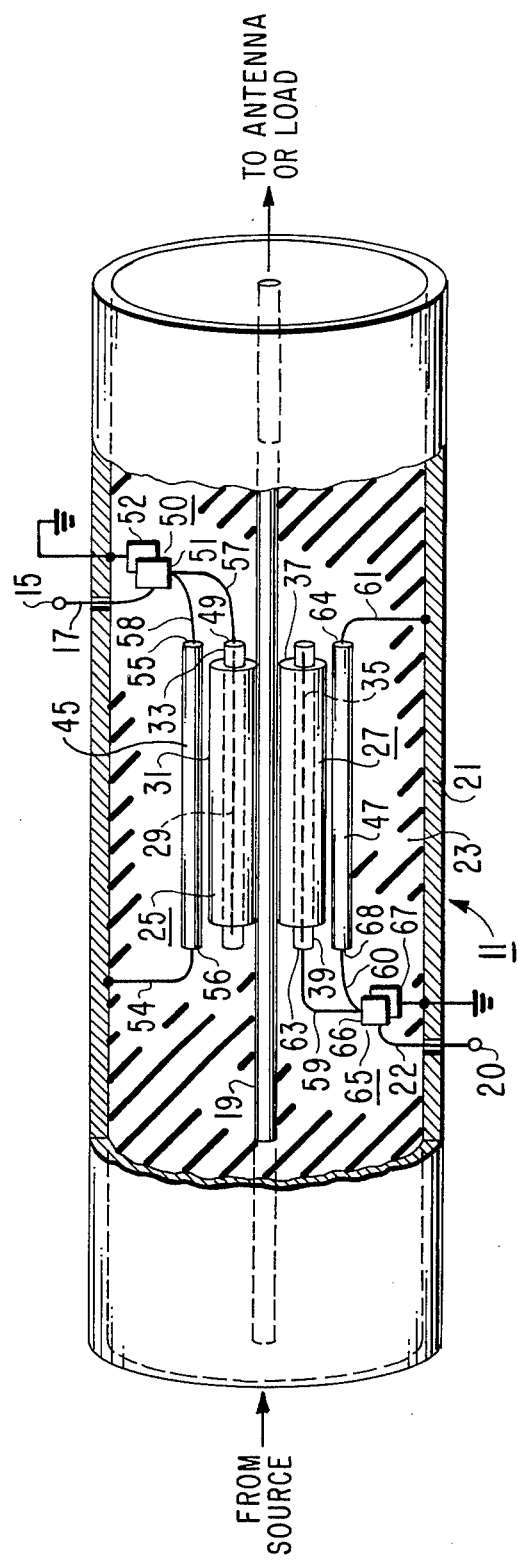

Referring to FIG. 1, a coaxial transmission line 11 couples RF signal waves from a source such as a transmitter (not shown) to an antenna or load (not shown). The transmission line 11 has a center conductor 19 and outer transmission line 11 has a center conductor 19 and outer coaxial conductor 21. A body 23 of dielectric material is spaced between the center conductor 19 and outer conductor 21. In the region of the coupler of the present invention, a portion of the material 23 is removed and a pair of capacitive pick-up elements 25 and 27 are mounted adjacent to the center conductor 19. The pick-up element 25 is a coaxial line having a center conductor 29 and a coaxial outer conductor 31 with the center conductor 29 spaced from the outer conductor 31 by a dielectric 33. The outer conductor 31 is mounted directly on the center conductor 19 of transmission line 11. Likewise, the capacitive pick-up element 27 is a coaxial line having a center conductor 35 and an outer conductor 37 spaced by a dielectric body 39. The outer conductor 37 is mounted directly on the center conductor 19 of transmission line 11. A coupling loop 45 is closely spaced parallel to pick-up element 25. The loop 45 extends approximately the same length along conductor 19 and occupies the region approximately adjacent to the pick-up element 25 to thereby have essentially the same distribution of phase along the coupling loop 45 as along the coaxial pick-up element 25. Similarly, a second coupling loop 47 is spaced parallel to pick-up element 27. The loop 47 extends approximately the same length along the conductor 19 and occupies the region approximately adjacent to the pick-up element 27.

The end 49 of pick-up element 25 nearest the antenna or load is coupled via lead 57 to a lumped element summing capacitor 50 at electrode 51 to thereby provide a reverse power pick-up element. The opposite electrode 52 of capacitor 50 is coupled to RF ground or a point of reference potential at the outer conductor 21 of coaxial transmission line 11. The end 55 of the loop 45 nearest the antenna or load is also coupled via lead 58 to capacitor 50 at electrode 51 to thereby provide a reverse power coupling loop. The opposite end 56 of loop 45 is coupled via lead 54 to outer conductor 21 of the transmission line 11. The RF voltage at the output representing reverse power is coupled to terminal 15 via lead 17 from electrode 51 of capacitor 50. The end 63 of pick-up element 27 nearest the source is coupled via lead 59 to a lumped element summing capacitor 65 at electrode 66 to thereby provide a forward power pick-up element. The opposite electrode 67 of capacitor 65 is coupled to RF ground or a point of reference potential at the outer conductor 21 of coaxial transmission line 11. The end 68 of loop 47 nearest the source is also coupled via lead 60 to capacitor 65 at electrode 66 to provide a forward power coupling loop. The opposite end 64 of loop 47 is coupled via lead 61 to outer conductor 21 of the transmission line 11. The RF voltage representing forward power is coupled to terminal 20 via lead 22 from electrode 66 of capacitor 65.

Figure 2:
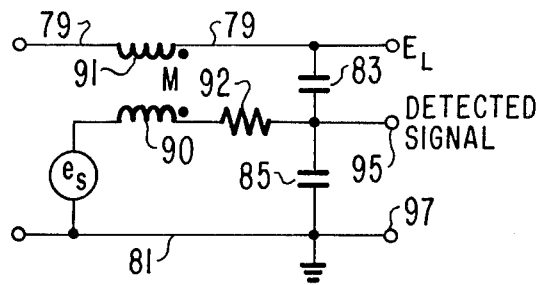
FIG. 2 is a schematic drawing of a portion of the detector of FIG. 1.

Referring to the schematic diagram of FIG. 2, and considering the reverse of reflected power coupling system in FIG. 1, the center conductor 19 is represented by conductor 79, the outer conductor 21 is represented by conductor 81, the distributed capacitance presented by capacitive pick-up element 25 is represented by capacitance 83, the lumped element summing capacitor 50 is represented by capacitance 85 and the mutual inductance (M) provided by the loop 45 closely spaced to the center conductor 19 of transmission line 11 is indicated by coils 90 and 91. The resistance 92 in FIG. 2 is the resistance of the coupling loop 45. In the embodiment shown in FIG. 1, the coupling loops 45 and 47 are made of a highly resistive material. The coupling loops 45 and 47 are, for example, 60 ohm ⅛ watt resistors which provide a very low Q (order of 0.2 to 0.1) series resonant circuit represented by elements 90, 92, and 85 in FIG. 2. Resistance 92 is proportioned with respect to coil 90 such that over a broadband of frequencies the impedance of this mesh is essentially resistive and of the value of resistor 92. The line current ($I_L$) in the transmission line is sampled by the loop 45 transformer action. The induced secondary voltage is represented by $e_x = -I_L J \omega M$, where M is the mutual inductance between the line and the coupling loop 45. Since the impedance is essentially resistive (low Q), the induced loop current ($I_{loop}$) is essentially equal to $e_s/R$.

Figure 3:
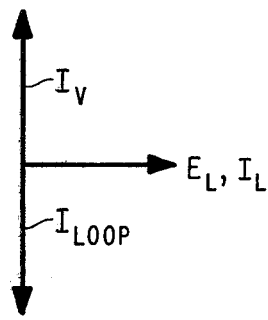
FIG. 3 is a vector diagram with the loop in FIG. 1 connected to monitor reflected or reverse power.

The line voltage ($E_L$) is coupled by the capacitive pick-up element 25 which occupies substantially the same region as the coupling loop 45. The capacitor 83 represents this pick-up capacitance of element 25. The capacitors 83 and 85 form a voltage divider. The current through capacitor 85 which is a derivative of the line voltage is represented by $I_V$ which is equal to $j E_L/(X_{C\,83} + X_{C\,85})$ is the capacitive reactance of capacitor 83 and $X_{C85}$ is the capacitive reactance of capacitor 85. The relative value of capacitance 85 compared to capacitance 83 is selected to maintain the magnitude of the current $I_V$ in capacitor 85 equal to the current sample from the loop ($I_{loop}$). The induced secondary voltage $e_s$ in the loop 45 for a transmission line VSWR (voltage standing wave ratio) of one-to-one lags the line current $I_L$ by 90°, and the current $I_V$ in capacitor 83 leads the line voltage by 90°. See FIG. 3. Accordingly, the current sample $I_V$ related to line voltage is 180° out of phase with the current sample $I_{loop}$, which is related to line current over a broad range of frequencies. Thus, for a VSWR of one-to-one, the two currents, $I_{loop}$ and $I_V$, flowing in capacitor 85 are of equal magnitude and are exactly 180° out of phase to provide a null and zero output. When the VSWR departs from a one-to-one ratio, reverse or reflected power flows causing a disparity in $I_{loop} - I_V$ with a resulting net current flow in capacitor 85 proportional to the reverse or reflected power.

Figure 4:
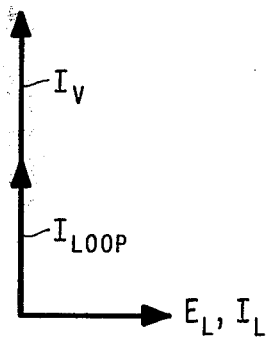
FIG. 4 is a vector diagram with the loop in FIG. 1 connected to monitor forward power.

If the inductor 90 in FIG. 2 is wound the same way as inductor 91, the system can be made to read forward or incident power either by reversing the direction of inductor 90 with respect to inductor 91 or by exchanging the terminal end of the coupling loop to which the summing capacitor is connected, thus changing the sign of mutual inductance (M) to (−M). The forward or incident power coupling loop represented in FIG. 1 by element 47 is connected to summing capacitor 65 at the end 68 nearest the source. Likewise the pick-up element 27 is coupled to summing capacitor 65 at the end nearest the source. The direction of the loop current ($I_{loop}$) is reversed 180°. The loop current $I_{loop}$ is therefore for VSWR of one-to-one additive in phase with the current sample $I_V$ coupled by capacitive pick-up element 27. In the diagram of FIG. 2, pick-up element 27 is now represented by capacitor 83 and summing capacitor element 65 by capacitor 85. As illustrated by the vector diagram of FIG. 4, the loop current ($I_{loop}$) associated with the currents coupled to element 47 for a one-to-one VSWR is added in phase with the current $I_V$ associated with that coupled from pick-up element 27. The two currents add vectorially and produce an RF voltage output proportional to the forward or incident power. Since the capacitive pick-up element and the loop in each case (forward or reverse power coupling) occupy approximately the same space relative to the line sampled and are of distributed parameter construction and since the impedance of the loop circuit is of a low Q, a uniform phase relation between the line current and line voltage derivatives is provided over a wide range of frequencies. These factors have proved essential in the current and voltage sampling techniques to provide high discrimination between forward and reverse power detection. The magnitude RF voltage output taken across either of the summing capacitors (represented by capacitor 85 in FIG. 2) is equal to the vector addition of the loop current ($I_{loop}$) and the current sample $I_V$ times the reactance of capacitor 85. This RF voltage across terminals 95 and 97 may be coupled to an RF voltmeter by coupling terminal 95 to the voltmeter. Terminal 95 represents terminals 15 or 20 in FIG. 1. The output at terminal 95 in FIG. 2 may also be coupled to a detector and the varying D.C. voltage used to either control a meter or be used to control the gain of one or more stages of the source.

What is claimed is:

1. In combination,
a distributed capacitive pick-up element coupled in series with a capacitor and positioned along a given length of one of the conductors of a transmission line for providing through said capacitor a first current proportional to the transmission line voltage,
a linear lumped element resistor body coupling element coupled in series with said capacitor and positioned along and closely spaced to said one conductor for providing strong mutual inductance therebetween and through said capacitor a second current in proportion to the transmission line current,
said resistor body coupling element being a linear body of essentially highly resistive material extending substantially said same given length of said one conductor and in the approximate region of said capacitive pick-up element to maintain the phase and magnitude of said second current relative to said line current essentially independent of frequency over a broad band of frequencies.

2. The combination of claim 1 wherein the relative value of capacitance of said capacitor and said pick-up element is selected to provide said first current equal in magnitude to said second current for conditions of one-to-one VSWR.

3. The combination of claim 2 wherein the value of capacitance of said capacitor is selected to form a circuit series resonant with said resistor body coupling element at the mid-operating frequency of the band of frequency waves propagated in a given direction along said transmission line.

4. The combination of claim 1 wherein said capacitive pick-up element is a section of coaxial transmission line with the outer conductor connected to said one conductor of said transmission line and the inner conductor coupled to said capacitor.

5. The combination of claim 4 wherein said one conductor is the center conductor of a coaxial transmission line.

* * * * *

UNITED STATES PATENT OFFICE
CERTIFICATE OF CORRECTION

PATENT NO. : 4,011,529

DATED : March 8, 1977

INVENTOR(S) : Arthur Garcia

It is certified that error appears in the above-identified patent and that said Letters Patent are hereby corrected as shown below:

In Column 1, lines 64 and 65, cancel "transmission line 11 has a center conductor 19 and outer". Column 3, line 6, "$e_x$" should read -- $e_s$ --; line 18, after " $E_L/(X_{C83} + X_{C85})$ " insert -- where $E_L$ equals line voltage, $X_{C83}$ --.

Signed and Sealed this fifth Day of July 1977

[SEAL]

Attest:

RUTH C. MASON
*Attesting Officer*

C. MARSHALL DANN
*Commissioner of Patents and Trademarks*